(12) United States Patent
Ahn

(10) Patent No.: US 8,101,338 B2
(45) Date of Patent: Jan. 24, 2012

(54) METHOD OF FORMING MICRO PATTERN OF SEMICONDUCTOR DEVICE

(75) Inventor: Sang Joon Ahn, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 708 days.

(21) Appl. No.: 12/037,144

(22) Filed: Feb. 26, 2008

(65) Prior Publication Data

US 2009/0111058 A1    Apr. 30, 2009

(30) Foreign Application Priority Data

Oct. 26, 2007   (KR) .................. 10-2007-0108195

(51) Int. Cl.
*G03F 7/26* (2006.01)
(52) U.S. Cl. ...................................... 430/312; 430/313
(58) Field of Classification Search .................. 430/311, 430/313, 322, 394, 396
See application file for complete search history.

(56) References Cited

U.S. PATENT DOCUMENTS

| | | | |
|---|---|---|---|
| 6,110,624 A * | 8/2000 | Hibbs et al. | 430/5 |
| 7,195,716 B2 * | 3/2007 | Chou | 216/41 |
| 2007/0264598 A1 * | 11/2007 | Chang et al. | 430/322 |

* cited by examiner

*Primary Examiner* — Kathleen Duda
(74) *Attorney, Agent, or Firm* — Marshall, Gerstein & Borun LLP

(57) ABSTRACT

The present invention relates to a method of forming a micro pattern of a semiconductor device. According to an aspect of the present invention, a first photoresist layer and a second photoresist layer with different exposure types are formed over a semiconductor substrate on which an etch target layer is formed, performing an exposure process on the second photoresist layer and the first photoresist layer. Second photoresist patterns are formed by developing the second photoresist layer. First photoresist patterns are formed by etching the first photoresist layer using an etch process employing the second photoresist patterns as an etch mask. Auxiliary patterns are formed by developing the first photoresist patterns. The etch target layer is etched by employing the auxiliary patterns.

24 Claims, 4 Drawing Sheets

METHOD OF FORMING MICRO PATTERN OF SEMICONDUCTOR DEVICE

CROSS-REFERENCES TO RELATED APPLICATIONS

This patent claims priority to Korean patent application number 10-2007-108195, filed on Oct. 26, 2007, the disclosure of which is incorporated by reference in its entirety.

TECHNICAL FIELD

This patent relates to a semiconductor device and, more particularly, to a method of forming a micro pattern of a semiconductor device.

BACKGROUND

As the integration level increases in a semiconductor device fabrication process, the size of a minimum pattern gradually decreases. The degree the size of the minimum pattern is reduced exceeds the resolution capability limit of a current exposure apparatus. In order to form a semiconductor device having a more micro pattern, an apparatus having a short wavelength light source and a good resolution capability is used.

To implement a micro line width required due to the high integration of devices, an X-ray or an E-beam is utilized. However, the X-ray or E-beam remains technical and productivity problems in an experimental level. A Double Exposure and Etch Technology (DEET) method has currently been proposed in order to form a micro pattern.

However, if the DEET method is employed, the Critical Dimension (CD) becomes poor because of overlay accuracy between adjacent patterns. There is a difficulty in Optical Proximity Correction (OPC) control due to circuit isolation according to the DEET method.

SUMMARY OF THE INVENTION

Embodiments directed to a method of forming a micro pattern of a semiconductor device, wherein a more micro pattern may be formed than the resolution of an exposure process by removing a problem in which the CD becomes poor due to overlay.

In an embodiment of the invention, a method of forming a micro pattern of a semiconductor device may include forming a first photoresist layer and a second photoresist layer with different exposure types over a semiconductor substrate on which an etch target layer is formed, performing an exposure process on the second photoresist layer and the first photoresist layer, forming second photoresist patterns by developing the second photoresist layer, forming first photoresist patterns by etching the first photoresist layer using an etching process employing the second photoresist patterns as an etch mask, forming auxiliary patterns by developing the first photoresist patterns, and etching the etch target layer by employing the auxiliary patterns.

A Bottom Anti-Reflective Coating (BARC) layer may be formed between the etch target layer and the first photoresist layer. Exposure regions may be formed in the first photoresist layer and the second photoresist layer at the same time using an exposure mask.

In another embodiment of the invention, a method of forming a micro pattern of a semiconductor device may include forming a first photoresist layer and the second photoresist layer over a semiconductor substrate over which a BARC layer is formed, forming second and first exposure regions, which are spaced apart from each other at specific intervals, in the second photoresist layer and the first photoresist layer, respectively, by performing an exposure process, forming second photoresist patterns by developing the second photoresist layer, forming first photoresist patterns by etching the first photoresist layer using an etching process employing the second photoresist patterns as an etch mask, and forming auxiliary patterns by developing the first photoresist patterns.

An etch target layer may be formed between the semiconductor substrate and the BARC layer. The second and first exposure regions may be formed in the first photoresist layer and the second photoresist layer, respectively, at the same time using an exposure mask.

A hard mask layer may be formed between the etch target layer and the BARC layer.

The first photoresist layer may be formed of a negative photoresist layer and the second photoresist layer may be formed of a positive photoresist layer. Alternatively, the first photoresist layer may be formed of a positive photoresist layer and the second photoresist layer may be formed of a negative photoresist layer.

At the time of the exposure process, the second exposure regions may be defined in the second photoresist layer at a first energy level and the first exposure regions may be defined in the first photoresist layer at a second energy level lower than the first energy level. Alternatively, at the time of the exposure process, the first exposure regions may be defined in the first photoresist layer at a third energy level and the second exposure regions may be defined in the second photoresist layer at a fourth energy level lower than the third energy level.

A pitch of the first and second exposure regions may be twice a pitch of a micro pattern formed at a final process. The second exposure regions and the first exposure regions may not formed at the same location, but may be spaced apart from each other at specific intervals.

BRIEF DESCRIPTION OF THE DRAWINGS

For a more complete understanding of the disclosure, reference should be made to the following detailed description and accompanying drawings wherein.

DETAILED DESCRIPTION

This patent is not limited to the disclosed embodiments, but may be implemented in various manners. The embodiments are provided to complete the disclosure of this patent and to allow those having ordinary skill in the art to understand the scope of this patent defined by the appended claims.

FIGS. 1A to 1G are sectional views illustrating a method of forming a micro pattern of a semiconductor device. This method may be applied to a line and space formation process or a contact hole pattern formation process of a flash memory device.

Figure 1A:
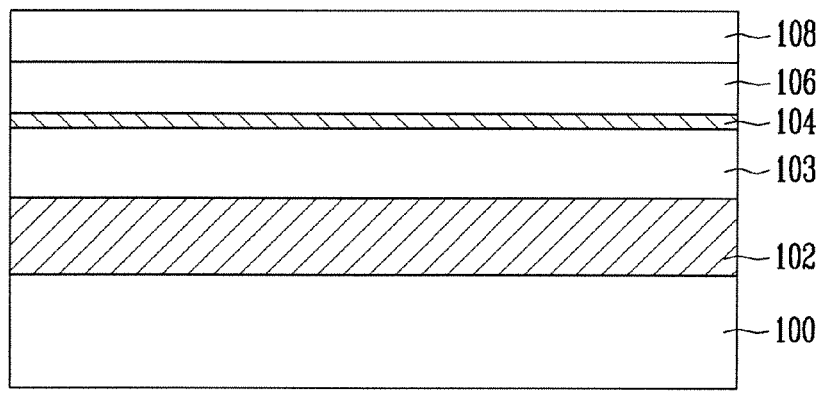
FIGS. 1A to 1G are sectional views illustrating a method of forming a micro pattern of a semiconductor device according to an embodiment of the invention.

Referring now to FIG. 1A, an etch target layer 102 is formed on a semiconductor substrate 100. The etch target layer 102 may be formed from an insulating material or a conductive material. A hard mask layer 103 may be formed on the etch target layer 102.

A BARC layer 104 is formed on the hard mask layer 103 and a baking process is then performed. A first photoresist layer 106 and a second photoresist layer 108 with different exposure types are formed on the BARC layer 104. The first photoresist layer 106 may have a negative or positive type and the second photoresist layer 108 may have a negative or positive type. After the first photoresist layer 106 and the second photoresist layer 108 are formed, a baking process is performed.

Figure 1B:
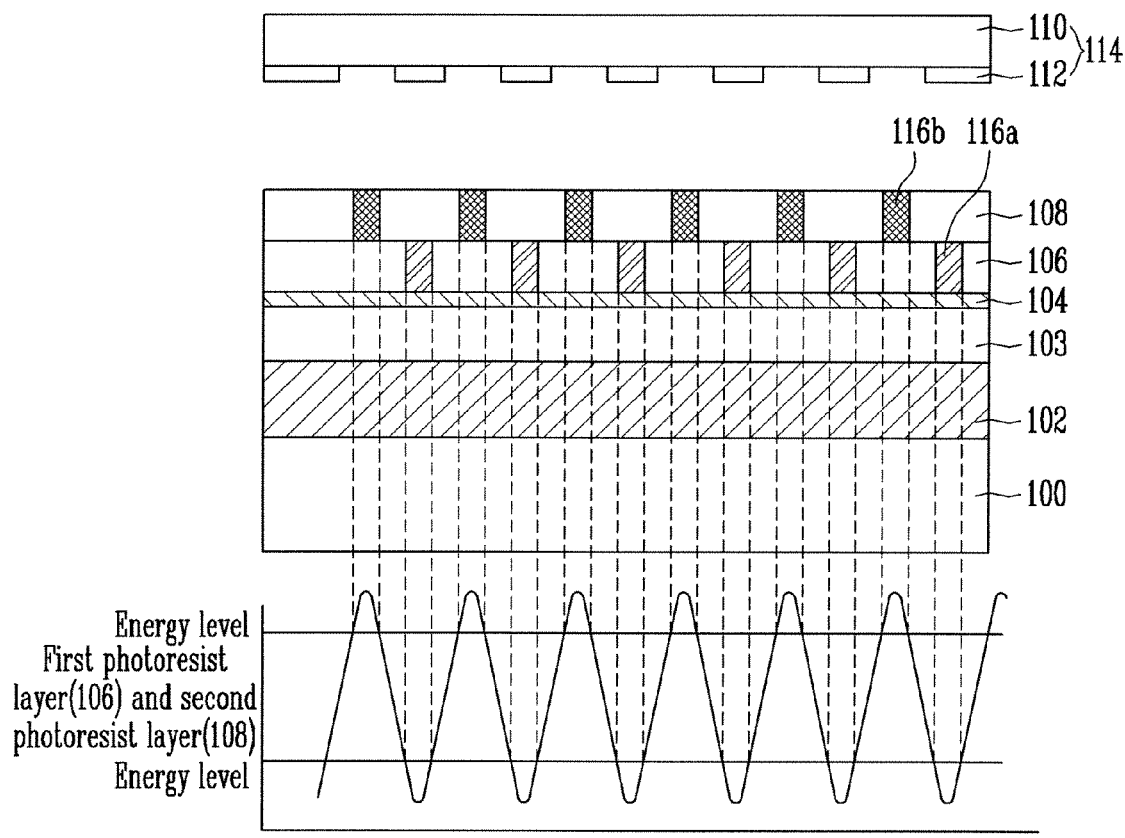
Figure 2:
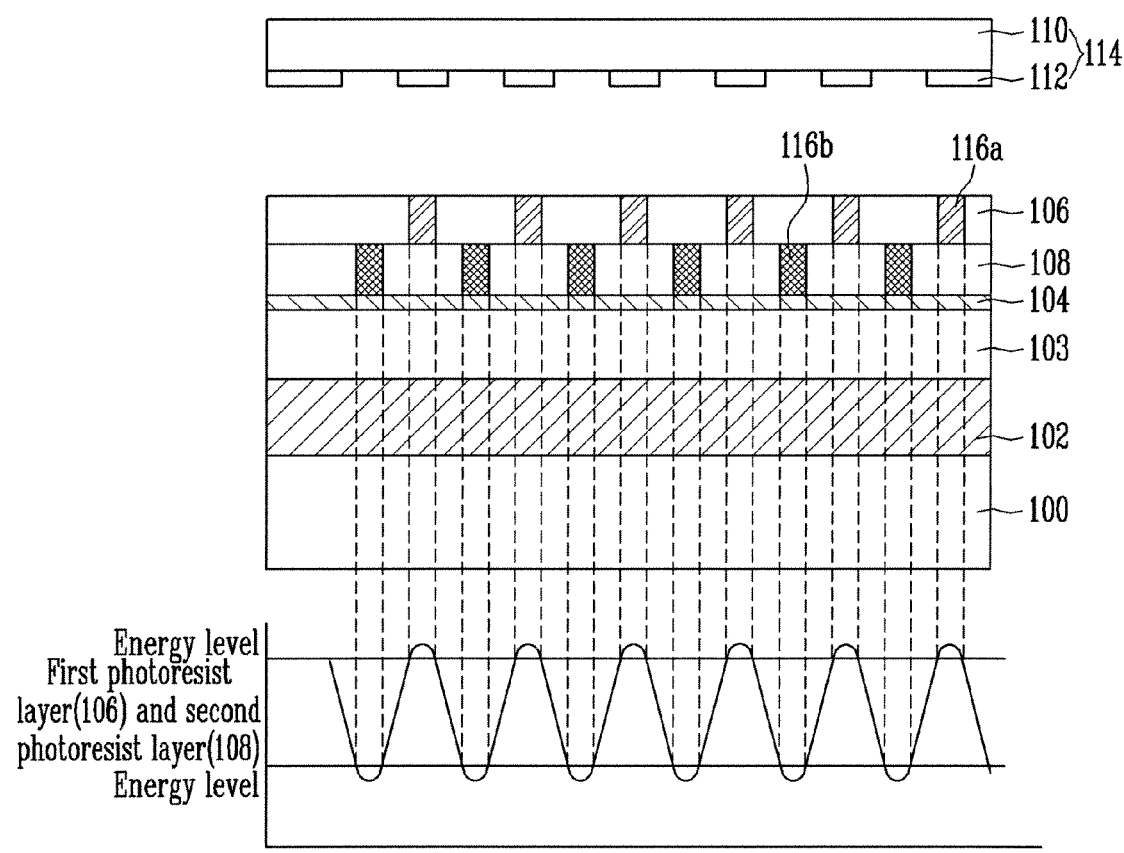
FIG. 2 is a sectional view illustrating a method of forming a micro pattern of a semiconductor device according to another embodiment of the invention.

Referring to FIGS. 1B and 2, an exposure process may be performed using an exposure mask 114 in which a plurality of chrome patterns 112 are formed on a quartz substrate 110. When the exposure process is performed, exposure energy is controlled such that first and second exposure regions 116a, 116b, respectively having the same width may be formed in a first photoresist layer 106 and a second photoresist layer 108, respectively. The first photoresist layer 106 may have a low energy level and the second photoresist layer 108 may have a high energy level. As shown in FIG. 1B, the second photoresist layer 108 may be formed after the first photoresist layer 106. Alternatively, the first photoresist layers 106 having a low energy level may be formed after the second photoresist layers 108 having a high energy level are formed, the first and second exposure regions 116a and 116b may be changed as shown in FIG. 2 during the exposure process. As described above, the exposure regions 116a, 116b may be formed in the first photoresist layer 106 and the second photoresist layer 108 at the same time using one exposure mask 114 to simplify the process.

As shown in FIG. 1B, the second exposure regions 116b are defined in the second photoresist layer 108 at a first energy level higher than the first photoresist layer 106, and the first exposure regions 116a are defined in the first photoresist layer 106 at a second energy level lower than the second photoresist layer 108.

A pitch of the first and second exposure regions 116a and 116b formed in the first photoresist layer 106 and the second photoresist layer 108 may be twice the pitch of a micro pattern formed by a final process. The first exposure regions 116a formed in the first photoresist layer 106 and the second exposure regions 116b formed in the second photoresist layer 108 may not formed at the same location, but may be spaced apart from each other at specific intervals. If the first photoresist layer 106 and the second photoresist layer 108 have the stack structure as described above, the first and second exposure regions 116a and 116b, which are spaced apart from each other at specific intervals, can be formed in the first photoresist layer 106 and the second photoresist layer 108 using once exposure process.

Figure 1C:
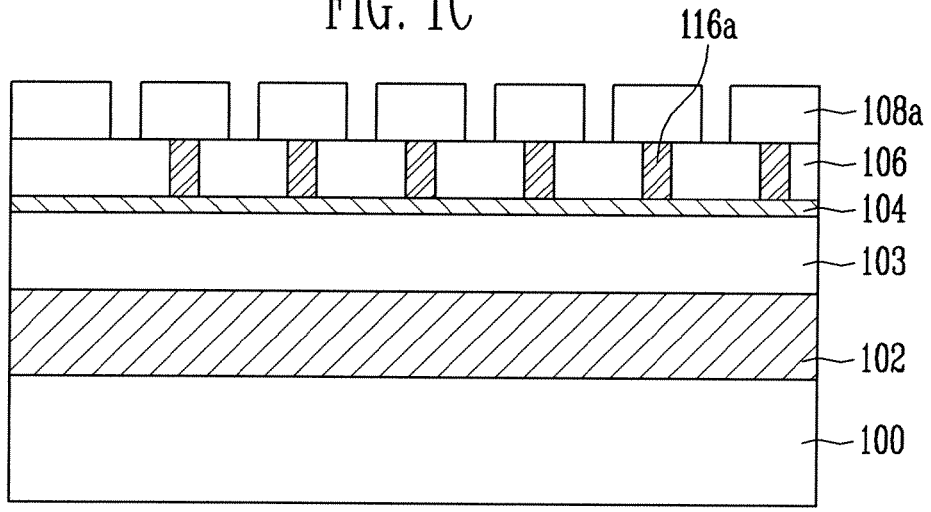

Referring to FIG. 1C, the second exposure regions 116b of the second photoresist layer 108 are removed using a development process, thus forming second photoresist patterns 108a.

Figure 1D:
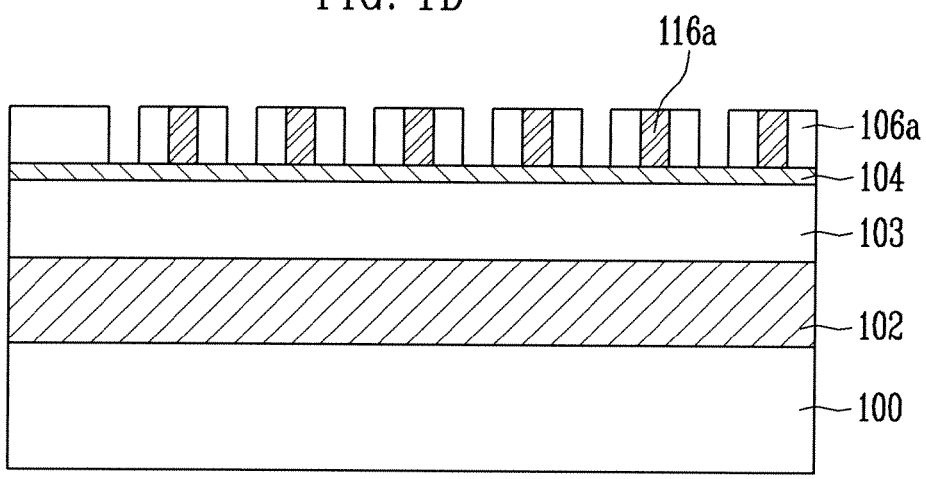

Referring to FIG. 1D, an etching process is performed using the second photoresist patterns 108a as an etch mask to etch the first photoresist layer 106, thus forming first photoresist patterns 106a. During the etching process for forming the first photoresist patterns 106a, the second photoresist patterns 108a on the first photoresist patterns 106a are removed completely.

Figure 1E:
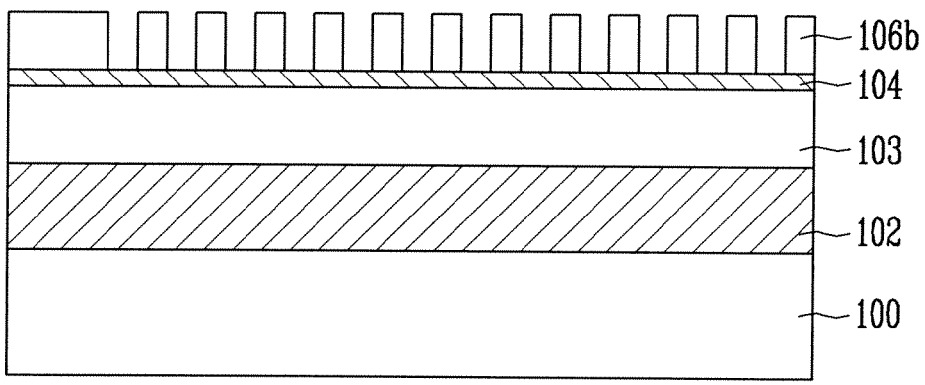

Referring to FIG. 1E, the first exposure regions 116a of the first photoresist patterns 106a are removed using a development process, thus forming a plurality of auxiliary patterns 106b. Each auxiliary pattern 106b has a desired line and space. The auxiliary patterns 106b may be applied to a line and space pattern formation process and as well as a contact hole formation process. As described above, if the first photoresist patterns 106a are formed using the etching process of the first photoresist layer 106 employing the second photoresist patterns 108a and the auxiliary patterns 106b are then formed by developing the first exposure regions 116a formed in the first photoresist patterns 106a, a pattern having a target pitch is formed.

Figure 1F:
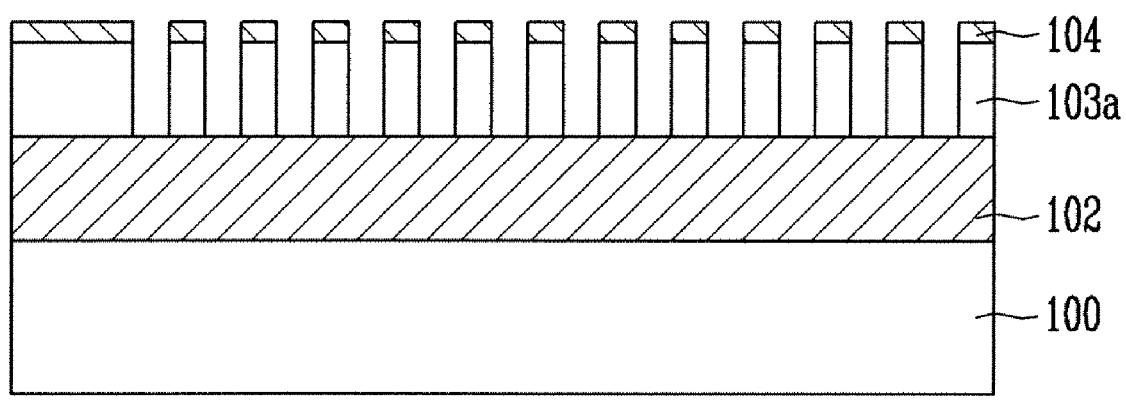

Referring to FIG. 1F, the BARC layer 104 and the hard mask layer 103 are etched using the auxiliary patterns 106b, e.g. the patterns having a target pitch, as an etch mask, thus forming hard mask patterns 103a having a desired line and space.

Figure 1G:
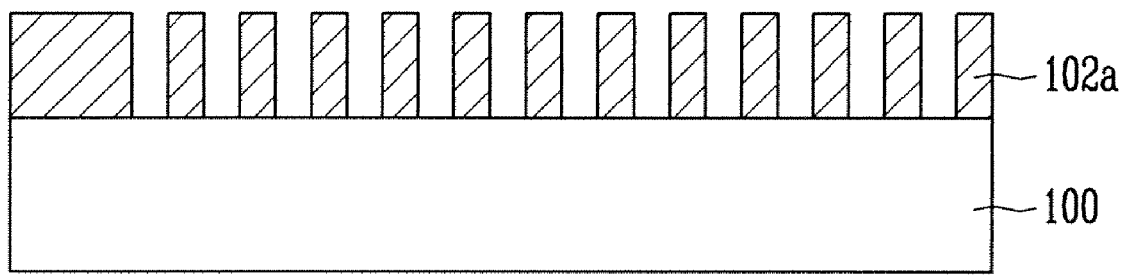

Referring to FIG. 1G, the etch target layer 102 is etched using the hard mask patterns 103a respectively having a desired line and space as an etch mask, thus forming target patterns 102a. The remaining auxiliary patterns 106b, the BARC layer 104 and the hard mask patterns 103a are then removed.

As described above, the first photoresist layer 106 and the second photoresist layer 108 are formed to have the stack structure. Accordingly, the first and second exposure regions 116a, 116b having a smaller pitch than the limit resolution of an exposure apparatus may be formed in the first photoresist layer 106 and the second photoresist layer 108 using an exposure process employing the exposure mask 114.

Further, as described above, if the first and second exposure regions 116a, 116b having a smaller pitch than the limit resolution of an exposure apparatus are formed using an exposure process employing the exposure mask 114, the difficulty of overlay control, which occurs due to the DEET method, may be overcome. Accordingly, all types of micro patterns may be formed while solving a problem that the CD becomes poor.

Moreover, as described above, the first and second exposure regions 116a, 116b may be formed in the first photoresist layer 106 and the second photoresist layer 108 using an exposure process employing one exposure mask 114. Accordingly, exposure process steps and etching process steps may be shortened and therefore the TAT (Turn Around Time) may be reduced.

What is claimed is:

1. A method of forming a micro pattern of a semiconductor device, the method comprising:

forming a first photoresist layer and a second photoresist layer with different exposure types of resists, one of which is a positive resist and the other of which is a negative resist, over a semiconductor substrate on which an etch target layer is formed;

forming second exposure regions in the second photoresist layer and forming first exposure regions in the first photoresist layer by performing an exposure process using one exposure mask, wherein the second exposure regions and the first exposure regions are formed at different energy levels;

forming second photoresist patterns by developing the second photoresist layer, wherein each of the second photoresist patterns covers exposed regions of the first photoresist layer and has wider width than the covered exposed regions;

forming first photoresist patterns by etching the first photoresist layer using an etching process employing the second photoresist patterns as an etch mask;

forming auxiliary patterns by removing the exposed regions included in the first photoresist patterns using a development process; and etching the etch target layer by employing the auxiliary patterns.

2. The method of claim 1, further comprising forming a bottom anti-reflective coating (BARC) layer between the etch target layer and the first photoresist layer.

3. The method of claim 2, further comprising forming a hard mask layer between the etch target layer and the BARC layer.

4. The method of claim 1, wherein the first photoresist layer is formed of a negative photoresist layer, and the second photoresist layer is formed of a positive photoresist layer.

5. The method of claim 1, wherein the first photoresist layer is formed of a positive photoresist layer, and the second photoresist layer is formed of a negative photoresist layer.

6. The method of claim 1, wherein exposure regions are formed in the first photoresist layer and the second photoresist layer using an exposure mask.

7. The method of claim 1, wherein at the time of the exposure process, second exposure regions are defined in the second photoresist layer at a first energy level, and first exposure regions are defined in the first photoresist layer at a second energy level lower than that the first energy level.

8. The method of claim 7, wherein a pitch of the first and second exposure regions is twice a pitch of a micro pattern formed by a final process.

9. The method of claim 7, wherein the second exposure regions and the first exposure regions are spaced apart from each other at specific intervals.

10. The method of claim 1, wherein at the time of the exposure process, first exposure regions are defined in the first photoresist layer at a third energy level, and second exposure regions are defined in the second photoresist layer at a fourth energy level lower than the third energy level.

11. The method of claim 10, wherein a pitch of the first and second exposure regions is twice a pitch of a micro pattern formed by a final process.

12. The method of claim 10, wherein the second exposure regions and the first exposure regions are spaced apart from each other at specific intervals.

13. A method of forming a micro pattern of a semiconductor device, the method comprising:
   forming a first photoresist layer and a second photoresist layer over a semiconductor substrate over which a Bottom Anti-Reflective Coating (BARC) layer is formed;
   forming second exposure regions in the second photoresist layer and forming first exposure regions in the first photoresist layer by performing an exposure process using one exposure mask, wherein the second exposure regions and the first exposure regions are formed at different energy levels so that each of the second exposure regions is positioned between neighboring first exposure regions;
   forming second photoresist patterns by developing the second photoresist layer, wherein each of the second photoresist patterns covers one of the first exposure regions and has a wider width than the covered first exposure region;
   forming first photoresist patterns by etching the first photoresist layer using an etching process employing the second photoresist patterns as an etch mask; and
   forming auxiliary patterns by removing the first exposure regions included in the first photoresist patterns using a development process.

14. The method of claim 13, further comprising forming an etch target layer between the semiconductor substrate and the BARC layer.

15. The method of claim 14, further comprising forming a hard mask layer between the etch target layer and the BARC layer.

16. The method of claim 13, wherein the first photoresist layer is formed of a negative photoresist layer, and the second photoresist layer is formed of a positive photoresist layer.

17. The method of claim 13, wherein the first photoresist layer is formed of a positive photoresist layer, and the second photoresist layer is formed of a negative photoresist layer.

18. The method of claim 13, wherein the second and first exposure regions are formed at the same time.

19. The method of claim 13, wherein at the time of the exposure process, the second exposure regions are defined in the second photoresist layer at a first energy level, and the first exposure regions are defined in the first photoresist layer at a second energy level lower than that the first energy level.

20. The method of claim 19, wherein a pitch of the first and second exposure regions is twice a pitch of a micro pattern formed by a final process.

21. The method of claim 19, wherein the second exposure regions and the first exposure regions are spaced apart from each other at specific intervals.

22. The method of claim 13, wherein at the time of the exposure process, the first exposure regions are defined in the first photoresist layer at a third energy level, and the second exposure regions are defined in the second photoresist layer at a fourth energy level lower than the third energy level.

23. The method of claim 22, wherein a pitch of the first and second exposure regions is twice a pitch of a micro pattern formed by a final process.

24. The method of claim 22, wherein the second exposure regions and the first exposure regions are spaced apart from each other at specific intervals.

* * * * *